US009754849B2

(12) United States Patent
Huang et al.

(10) Patent No.: US 9,754,849 B2
(45) Date of Patent: Sep. 5, 2017

(54) ORGANIC-INORGANIC HYBRID STRUCTURE FOR INTEGRATED CIRCUIT PACKAGES

(71) Applicant: INTEL CORPORATION, Santa Clara, CA (US)

(72) Inventors: Plory Huang, New Taipei (TW); Henry Su, Taipei (TW); Chee Key Chung, Taipei (TW); Ryan Ong, Taipei (TW); Jones Wang, Da-Xiang (TW); Daniel Hsieh, Taipeti (TW)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/581,575

(22) Filed: Dec. 23, 2014

(65) Prior Publication Data

US 2016/0181169 A1    Jun. 23, 2016

(51) Int. Cl.
*H01L 23/02*        (2006.01)
*H01L 23/13*        (2006.01)
(Continued)

(52) U.S. Cl.
CPC ............ *H01L 23/13* (2013.01); *H01L 21/486* (2013.01); *H01L 23/49816* (2013.01); *H01L 23/49894* (2013.01); *H01L 23/5384* (2013.01); *H01L 24/17* (2013.01); *H01L 24/81* (2013.01); *H01L 25/0652* (2013.01); *H01L 25/50* (2013.01); *H01L 23/15* (2013.01); *H01L 2224/16235* (2013.01); *H01L 2224/73204* (2013.01); *H01L 2224/8121* (2013.01); *H01L 2224/81192* (2013.01); *H01L 2224/81815* (2013.01);
(Continued)

(58) Field of Classification Search
CPC ................. H01L 24/97; H01L 23/5389; H01L 2924/15787; H01L 2924/181; H01L 23/49827
USPC ....... 257/782, 783, 706, 707, 678, 684, 698, 257/701, 703
See application file for complete search history.

(56) References Cited

U.S. PATENT DOCUMENTS 6,906,407 B2 *   6/2005   Byers ................. H01L 25/0657
                                             257/685
7,586,183 B2 *   9/2009   Kawabata ........... H01L 23/5385
                                             257/686
(Continued)

FOREIGN PATENT DOCUMENTS

CN     103165477     6/2013
TW     201405734     2/2014
TW     201426965     7/2014

OTHER PUBLICATIONS

English Translation of Search Report from counterpart Taiwan Patent Application No. 104138580, dated Mar. 30, 2017, 1 page.

*Primary Examiner* — S. V. Clark
(74) *Attorney, Agent, or Firm* — Schwabe, Williamson & Wyatt P.C.

(57) ABSTRACT

An organic-inorganic hybrid structure is described for integrated circuit packages. In one example, an integrated circuit package includes a ceramic frame having a top side and a bottom side, the top side having a pocket with a bottom floor and a plurality of conductive through holes in the bottom floor, an integrated circuit die attached to the bottom floor over the conductive through holes, and a redistribution layer on the bottom side connected to the conductive through holes.

17 Claims, 8 Drawing Sheets

(51) Int. Cl.
  H01L 23/00 (2006.01)
  H01L 23/498 (2006.01)
  H01L 21/48 (2006.01)
  H01L 23/538 (2006.01)
  H01L 25/065 (2006.01)
  H01L 25/00 (2006.01)
  H01L 23/15 (2006.01)

(52) U.S. Cl.
  CPC ........... *H01L 2224/83192* (2013.01); *H01L 2225/06517* (2013.01); *H01L 2225/06548* (2013.01); *H01L 2924/014* (2013.01); *H01L 2924/0105* (2013.01); *H01L 2924/15153* (2013.01); *H01L 2924/15311* (2013.01)

(56) References Cited

U.S. PATENT DOCUMENTS

| | | | |
|---|---|---|---|
| 8,193,034 B2* | 6/2012 | Pagaila | H01L 21/6835 257/686 |
| 8,592,992 B2 | 11/2013 | Lin et al. | |
| 8,643,164 B2* | 2/2014 | Kaufmann | H01L 23/5389 257/686 |
| 8,937,381 B1* | 1/2015 | Dunlap | H01L 23/3128 257/686 |
| 8,980,691 B2* | 3/2015 | Lin | H01L 25/50 257/686 |
| 8,981,554 B2* | 3/2015 | Kim | H01L 23/34 257/686 |
| 8,981,570 B2 | 3/2015 | Tseng et al. | |
| 8,987,919 B2* | 3/2015 | Tanaka | H01L 23/3135 257/686 |
| 8,994,184 B2* | 3/2015 | Pagaila | H01L 21/486 257/686 |
| 9,029,998 B2* | 5/2015 | Jang | H01L 23/34 257/686 |
| 9,368,438 B2 | 6/2016 | Lin et al. | |
| 2008/0116564 A1* | 5/2008 | Yang | H01L 23/5389 257/698 |
| 2008/0157330 A1* | 7/2008 | Kroehnert | H01L 21/4871 257/686 |
| 2010/0308453 A1* | 12/2010 | Scheid | H01L 23/3675 257/698 |
| 2013/0003319 A1* | 1/2013 | Malatkar | H01L 25/16 361/746 |
| 2016/0027764 A1* | 1/2016 | Kim | H01L 24/97 257/686 |

* cited by examiner

ORGANIC-INORGANIC HYBRID STRUCTURE FOR INTEGRATED CIRCUIT PACKAGES

FIELD

The present description relates to integrated circuit packaging and, in particular, a package of dies in a ceramic frame.

BACKGROUND

As computing devices are made smaller with more wiring connections, IC (Integrated Circuit) die packages are developed that include more than one die in a single package. Since the die is normally much smaller than a package, the additional dies do not significantly increase the size of the package. Accordingly by combining multiple dies in a single package, fewer packages are required for the device allowing the device to be smaller and reducing the distance between the dies. The long connection path between two dies in different packages may reduce the speed of the data communications between the dies. These longer connections have more reactance and more impedance and are more susceptible to noise and interference. All of these characteristics restrict the amount of data that can be carried through the data over a particular time interval.

The dies inside a package can be connected by stacking the dies and attaching the front side of one die to the back side of the other die. Vias through the back side of the die allow for the dies to connect directly. The dies inside a package can also be connected using an interposer. There are a variety of different interposer configurations but in most of these the dies are attached to the interposer and the interposer is used to carry signals between the dies and perhaps also to a package substrate.

BRIEF DESCRIPTION OF THE DRAWINGS

Embodiments of the invention are illustrated by way of example, and not by way of limitation, in the figures of the accompanying drawings in which like reference numerals refer to similar elements.

FIGS. 16-18 are cross-sectional side view diagrams of process stages in the assembly of a package using the ceramic frame of FIG. 15 according to an embodiment.

DETAILED DESCRIPTION

As described herein, a ceramic frame allows for many IC (Integrated Circuit) dies to be packaged in a small amount of space. The dies may be stacked with at least two layers into pockets of the frame. Multiple pockets may be used to allow ten or more IC dies to be mounted in a frame to create a single package. The pocketed ceramic frame eliminates any need for a silicon interposer and provides plenty of high speed data bandwidth for I/O (Input/Output) signals between dies.

Figure 1:
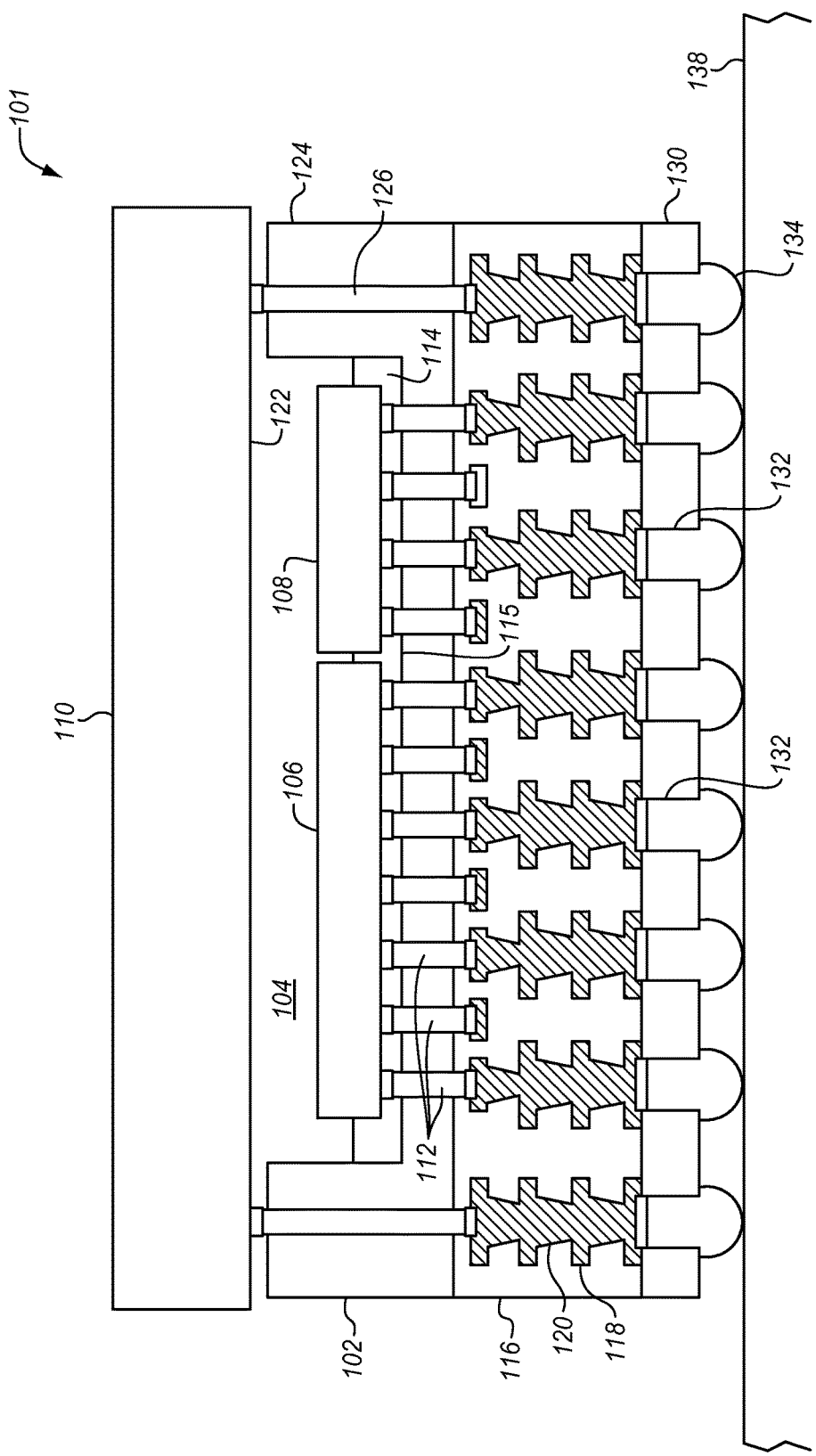
FIG. 1 is a cross-sectional side view diagram of a stacked die package using a ceramic frame according to an embodiment.

FIG. 1 is a cross-sectional side view of an example of a package 101 with three IC dies 106, 108, 110 packaged together into a ceramic frame 102. The ceramic frame has four exterior side walls 124 which are sized to hold the intended dies. In one example the walls are about 100-400 µm high. A pocket 104 is formed within the four side walls which is about 50-300 µm deep from the top of the side walls. The pocket is formed around the center of the package and is large enough to accommodate one or more dies side-by-side in a flat bottom surface of the pocket. The side walls of the pocket are thick enough to accommodate drilled holes 126 that extend from the top of the side walls to the bottom of the frame. There may be many such through holes sufficient to accommodate the I/O needs for one of the dies.

The bottom floor 115 of the pocket has an array of through holes 112 drilled through the bottom floor of the pocket through the bottom of the ceramic frame. These through holes are filled or plated with a conductive material. In some embodiments the through holes are electroplated with pure Sn or with a Sn/Cu alloy. The through holes are aligned with the I\O pads or lands of the dies so that the two dies 106, 108 that are attached to the bottom floor 115 of the pocket 104 are simply soldered in place over the through holes. The dies may be attached over bumps formed from the electroplated pure Sn or Sn/Cu alloy inside the through holes.

By filling the through holes and then processing the ceramic frame through a reflow furnace at low temperature the electroplated metal expands upward and downward in the through holes under the furnace heat to form pure Sn or Sn/Cu alloy bumps on each end. These bumps allow the dies to be directly attached to the electroplating material using a second reflow furnace process. This technique avoids a separate surface finish process and micro-solder ball attachment process. However, a variety of other techniques may be used to make the holes conductive and provide solder bumps to attach dies and passive devices.

After the dies are attached to the floor of the pocket, an underfill 114 may be used to isolate and protect the solder connections.

With a pocket depth sufficient to fully enclose the first two dies 106, 108 on three sides, the side walls 126 of the frame extend up above the tops of the two dies in the pocket. There may be more or fewer than two dies in the pocket, depending on the particular implementations. Two dies is shown as an example. These side walls may be left as is so that the package contains only the two dies.

As shown a third larger die 110 may be used to cover the top of the pocket. This larger die may be larger or it may be made to have a larger form factor by attaching it to a larger substrate or some other larger structure. The larger die extends across the pocket from one side wall to the other. In this way the larger die seals the pocket to protect the two dies and the solder connections inside the pocket. The larger die may be sealed with metallic or dielectric layer, a resin overmold or in any of a variety of other ways. The top die 110 may be used to seal the pocket or the top die may be smaller than the pocket opening on one or more sides. The gap between the edge of the die and the corresponding side wall may be used to allow air circulation in the pocket or it may be sealed with another material.

The top die 110 is attached to the side walls over the through holes 126 in the side walls. These through holes may be plated or filled with a conductive material and capped with a conductive material such as electroless nickel. The through holes are configured and arranged to meet with connection pads or lands on the top die. The top die accordingly may be soldered in place over the top of the pocket to connect to external components using the through holes.

The through holes 112 in the bottom floor 115 of the pocket 104 and the through holes 126 in the side walls are all drilled through to the bottom surface of the frame. All of the die connections then extend through to this one surface. A redistribution layer 116 is formed on the bottom surface of the ceramic frame to connect the dies to each other and to make connections to external components. In the illustrated example, one of the dies in the pocket is a CPU (Central Processing Unit) 106 and the other die is a chip set 108. These dies are typically coupled together through a high speed bus. The electrical connections of this bus may be made through the redistribution layer 116. The top die 110 is a memory and functional IC, such as SDRAM (Static Dynamic Random Access Memory) or DRAM (Dynamic Random Access Memory). The memory may be connected directly to the CPU or the chipset, depending on the system architecture, through the redistribution layer.

The redistribution layer may be formed in any of a variety of different ways. In some embodiments a BBUL (Bumpless Build-Up Layer) is formed with multiple layers of horizontal routing 118 and dielectric between each routing layer. The routing layers are connected using vias 120 that run through the dielectric to the routing layers. Alternatively, a silicon, resin, pre-preg or other type of substrate may be formed with one or more routing layers to interconnect the through holes 112, 126 to each other and to external connections.

The redistribution layer is finished with a ceramic bottom cap 130. The bottom cap may be made of the same material as or a different material from the ceramic frame. The bottom cap has a drilled through hole 132 for each redistribution layer via that is to be connected externally. The through holes are filled or electroplated with pure Sn or Sn/Cu alloy. The through holes may be treated in the same was as described above for the through holes in the ceramic frame. On the top side the through holes have a cover or pad to connect to a corresponding connection point in the redistribution layer. On the bottom side, each through hole has a solder ball, land, or pad 134 formed for example of Sn/Cu. These may be formed by expansion of the electroplating as described above, however, the invention is not so limited.

A C4 (Controlled Collapse Chip Connection) or BGA (Ball Grid Array) may be provided on the bottom of the bottom ceramic cap. The bump sizes may be scaled down to 30-50 μm, depending on the accuracy of the laser drilling, such as deep blind laser drilling and electroplated Sn or Sn/Cu techniques. The bottom solder ball allows the package to be soldered to a main board 138, a socket, or other substrate that connects the package to external devices. These devices may include power, user interface components, data I/O interface components, antennas, and other types of components, depending on the particular implementation.

For the example of FIG. 1, a significant portion of a workstation or computer is packaged in a single ceramic frame. The memory die 110 may include RAM so that the package is connected only to external mass storage, user interface, and graphics processors.

Figure 2:
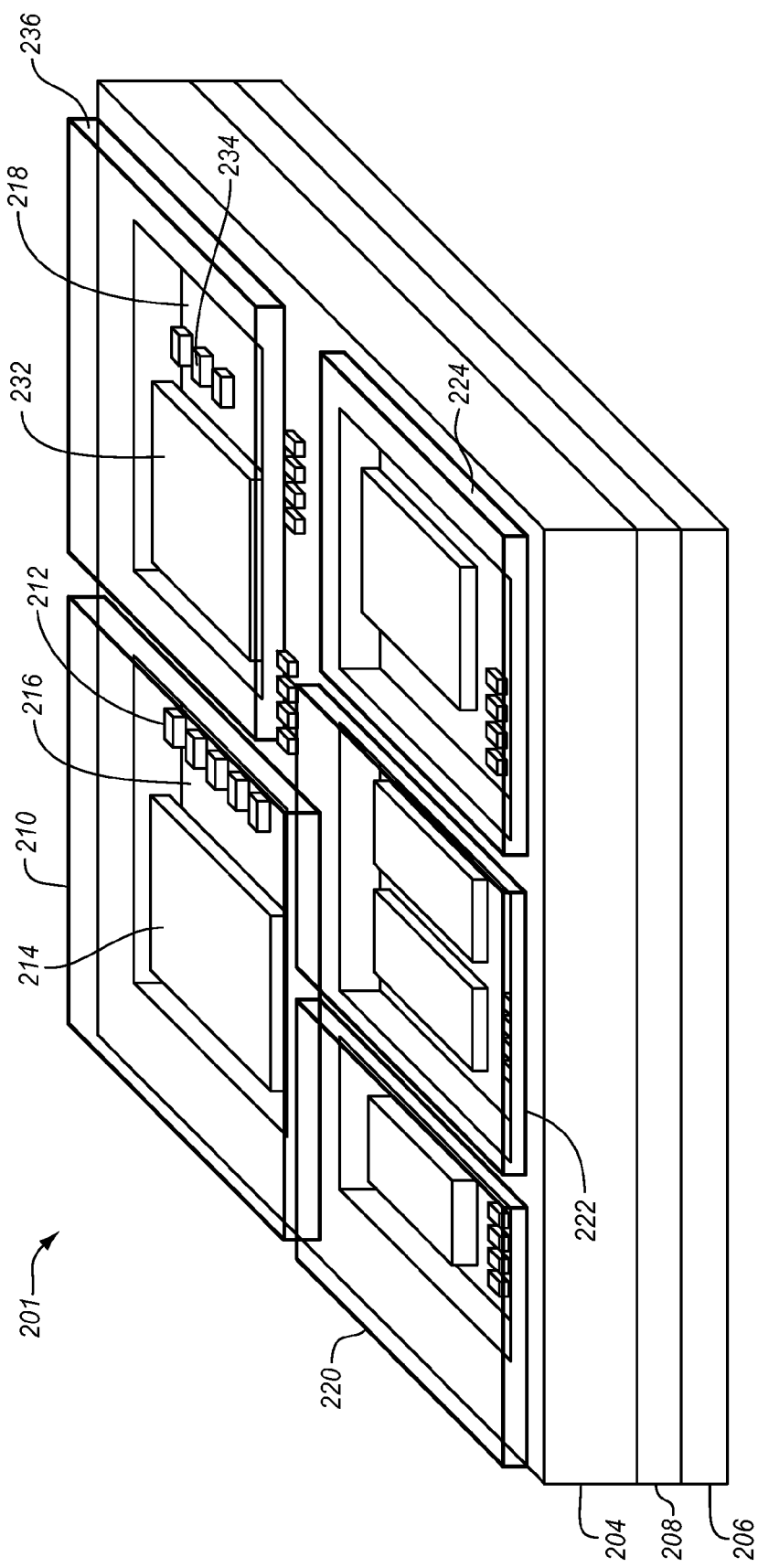
FIG. 2 is an isometric partially transparent view of a second stacked die package using a ceramic frame according to an embodiment.

FIG. 2 is an isometric partially transparent view of a larger package 201 based on a ceramic frame 204 with multiple pockets 216, 218, 220, 222, 224. Using more pockets, more dies may be packaged in the same frame 204. A redistribution layer 208 is attached to or formed on the bottom of the frame and a ceramic bottom cap 206 is attached to the bottom of the redistribution layer. The redistribution layer extends across the entire bottom surface of the frame between the multiple pockets. This allows for connections not only between dies in the same pocket as in FIG. 1, but also between dies in different pockets. These connections are made without running outside the package 201 so that the connections are shorter and more reliable.

The pockets may be made in different sizes and with different configurations of through holes to accommodate different sizes and styles of dies. In the illustrated example, there are five different pockets. The first pocket 216 has a CPU die 214 and passive devices 212 that are coupled to the die or between the dies and other external connections. The passive devices may be used for different purposes. The passive devices may be used for example for power conditioning or high speed data signaling conditioning. A memory die 214 is installed over the pocket to seal the pocket and provide high speed memory to the CPU.

The second pocket 218 has a chipset die 232, passive devices 234, and a memory die 236 over the pocket and the chipset. Accordingly, the chipset may be in the same pocket with the CPU as in FIG. 1 or in a separate pocket as shown. The particular configuration and use of the pockets may be adapted to suit the I/O, cooling, and other design configurations for a particular package.

The third 220, fourth 222, and fifth 224 pockets contain one or more additional dies and passive devices and are also covered by a memory or other functional IC die. The particular choice of dies may be made based on the intended use of the package. For a computer system package the additional dies may include additional CPU's, graphics processors, co-processors, network interfaces, radio communications baseband or RF modules, audio modules, image processing modules, memory modules, an other types of dies.

All of these IC dies may be packaged at the same time, increasing the stability of the assembly process. The dies may all be placed over the through holes directly with no need for solder resist on the substrate surfaces. This avoids more alignment and FM/stain issues that may arise from a solder resist coating process.

The complete package may be assembled in a variety of different ways. In some embodiments, after forming the through holes and the pockets, all of the through holes 112, 126 are filled with electroplated pure Sn or Sn/Cu alloy. Before die attachment the package is subjected to a simple reflow furnace process at low temperature to make the plated metal inside the through holes expand vertically up and down to form pure Sn or Sn/Cu alloy bumps. After the solder bumps have been formed by expansion the bottom layer IC dies and passive devices are placed on top of the through holes 112 inside the pocket and filled with underfill. Next the top layer IC dies are placed on top of the side wall through holes 126. Finally the whole package is passed through a second simple reflow furnace process to finish the assembly. The ceramic frame with through holes and pockets allows all of the IC dies and passive devices in two layers to be assembled at one time and with one pass through the reflow furnace. This is faster than many other die stacking package and subjects the dies to less thermal stress.

A variety of different ceramic materials may be used for the frame and the bottom cap. These include aluminum oxides, aluminum nitrite, zirconium toughened alumina, and other materials. These ceramics have a CTE (Coefficient of Thermal Expansion) that is much closer to that of a silicon die than that of a conventional organic substrate or resin such as FR-4. As a result, the warpage issues caused when bonding heterogeneous materials is greatly reduced. These ceramics also have much higher heat conductivity than organic resins and other typical substrates. This allows the ceramic to be used for heat dissipation in a high density 2.5D or 3D IC package. The heat from the dies may be drawn out through the solder balls or pads through the vias and then into the ceramic. The heated ceramic is able to dissipate the heat through its outer surface. Heat dissipation may be increased by applying heat spreaders, fins, radiators, or coolers to one or more exterior surfaces of the package. The side walls provide a significant heat radiation surface that may be enhanced with additional heat radiators.

Figure 3:
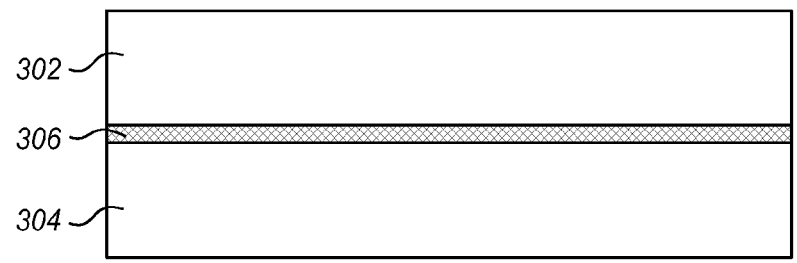
FIGS. 3-16 are cross-sectional side view diagrams of process stages in the fabrication of a ceramic frame according to an embodiment.

FIGS. 3-16 show a sequence of operations that may be used to fabricate a ceramic frame, redistribution layer and bottom cap as described above. In FIG. 3, first and second ceramic slabs 302, 304 are bonded together with a peelable paste. This allows some of the processes to be performed simultaneously on the top and the bottom for two packages. However, the same approach may be used to work on only one side at a time. FIG. 3 is cross-sectional diagram of only a portion of a ceramic slab for which only one pocket is formed on each side. A much larger ceramic slab may be used so that multiple pockets may be formed at the same time. Accordingly, both slabs 302, 304 may extend to the left and the right on the page and also in front of and behind the cross-sectional view as shown.

The ceramic slabs may be 100 to 400 μm thick from top to bottom so that the two slabs together are 200-700 μm tall as shown. The particular dimensions may be adapted to suit many different sizes of dies and eventual package forms. The peelable paste attaches the two ceramic cores together and may be of a type used for example for PCB/FPC (Printed Circuit Board/Flexible Printed Circuit) manufacturing.

Figure 4:
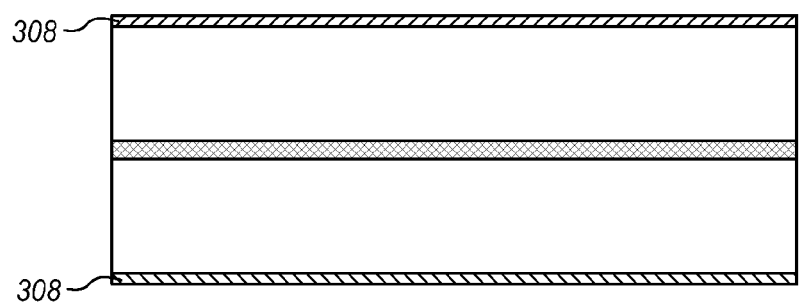

In FIG. 4, the panels are both covered with a copper layer 308. This may be done in many different ways. In some embodiments Tl/Cu is sputtered over the surface to seed the surface and then Cu is electroplated over the sputtered surface. An alumina ceramic core on market has a Ra (Average surface Roughness) of about 0.5 um which is similar to that of a typical Cu trace. Accordingly the bonding between ABF (Ajinomoto Build-up Film) layers and the ceramic core is very good.

Figure 5:
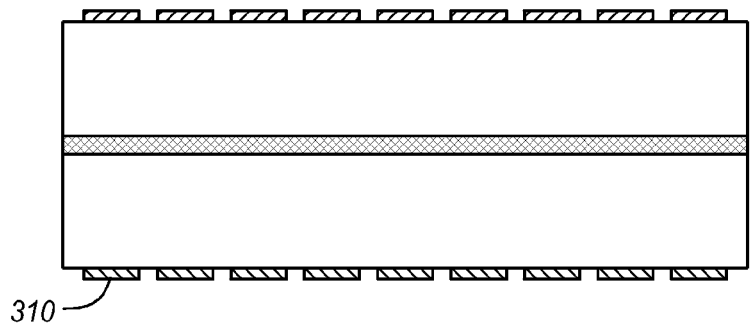
Figure 6:
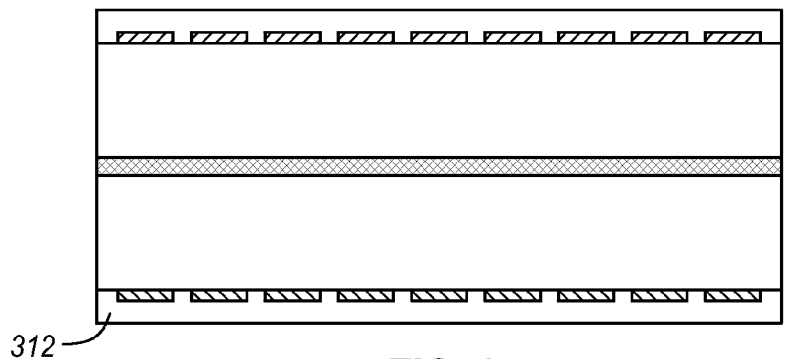
Figure 7:
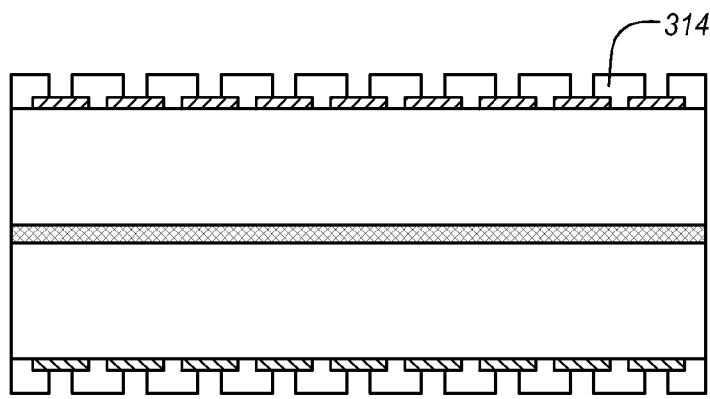
Figure 8:
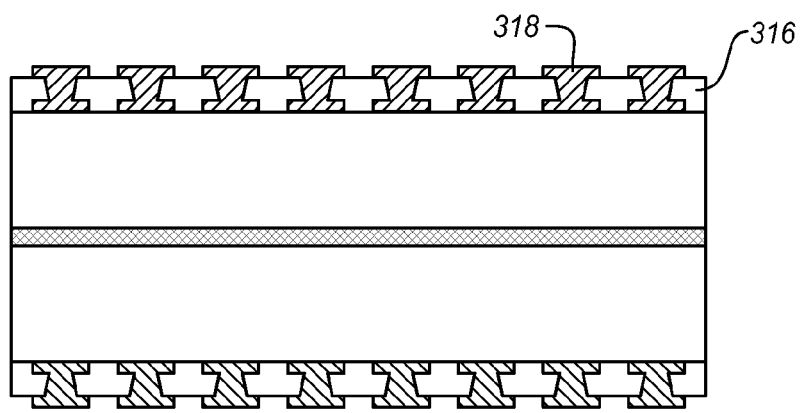

In FIG. 5, the copper layer 308 is patterned to form a patterned copper layer 310 on the top and bottom of the slabs. The copper may be patterned using photolithography techniques, laser machining or other techniques. In FIG. 6 an ABF layer 312 is applied over the patterned copper. The ABF isolates each patterned copper area from each other copper area. In FIG. 7, the ABF is pattered using laser drilling or any other desired technique. This creates vias 314 in the ABF over each copper land. In FIG. 8, a second layer of Cu is formed over the ABF and the vias. This copper layer includes filled vias 316 based on the drilled vias and a patterned horizontal copper layer 318. While the pattern is shown as a land over each via, this layer may include patterned traces that connect different ones of the vias to each other to establish a redistribution layer for the layer.

Figure 9:
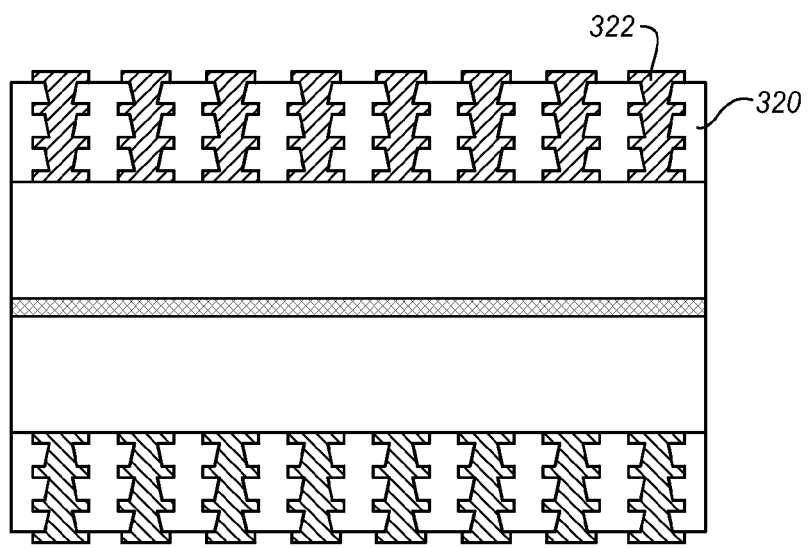

In FIG. 9, multiple copper routing and ABF isolation layers have been formed to complete a redistribution layer 320 over both the top 302 and bottom 304 slabs. The vias 316 of the redistribution layers may be capped with a pad 322 to provide connections to the structures that are to be formed over the redistribution layers.

Figure 10:
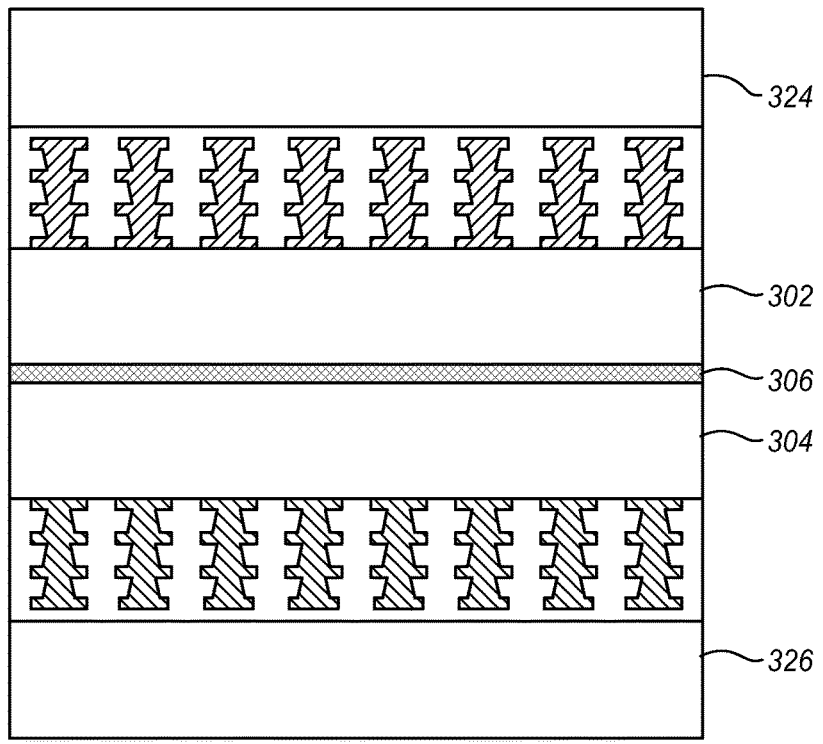

In FIG. 10 a second ceramic slab 324, 326 is applied over the top and bottom redistribution layers. These second slabs may be identical to the first two slabs 302, 304 or they may be shaped and fabricated especially for use as the top ceramic frame of the package.

Figure 11:
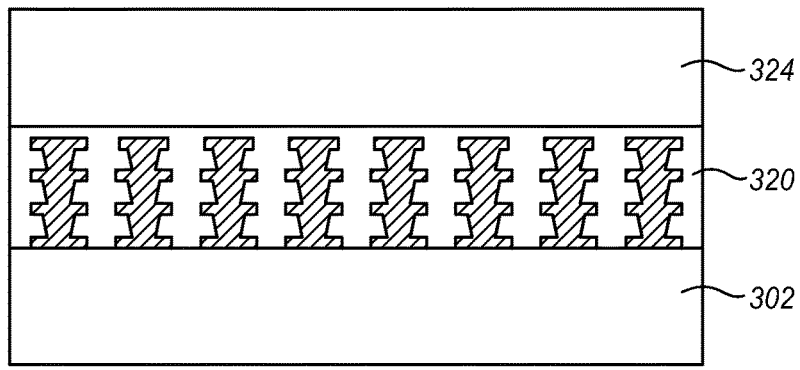
Figure 12:
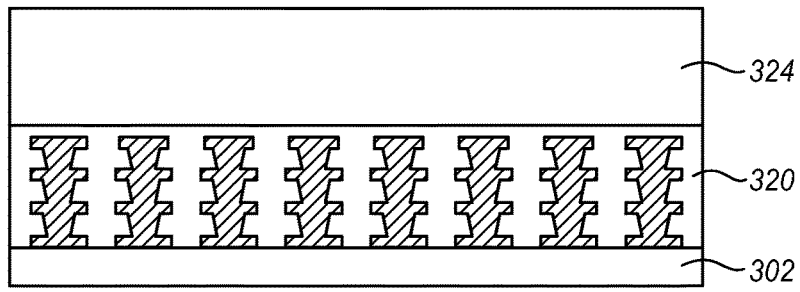

In FIG. 11, the peelable paste is released and the top and bottom packages are separated. This allows access to the inner ceramic slabs 302, 304 that will become the bottom caps of the package. In FIG. 12, the bottom cap is polished to reduce its thickness from e.g. 300 μm to 100 μm. The reduction in thickness reduces the size of the package and reduces the length of the connections from the package to the main board, socket or other substrate to which the package will be mounted. The eventual thickness of the bottom cap may be adapted to suit different implementations.

Figure 13:
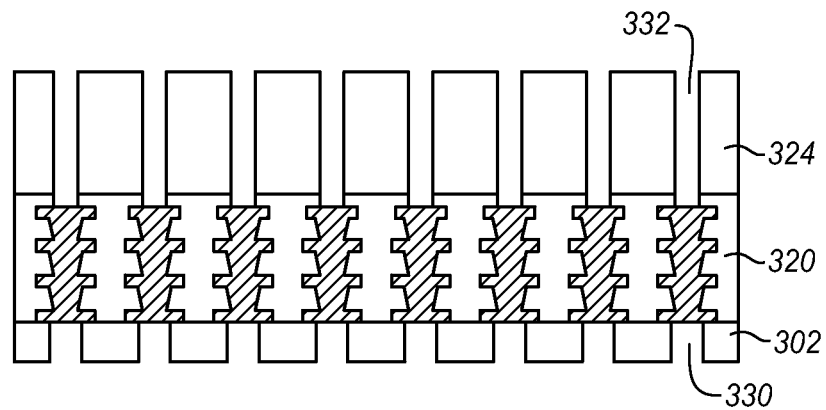

In FIG. 13, the through holes 330, 332 are formed on both the ceramic frame 324 and the bottom cap 302 of the assembly. Deep blind via laser drilling may be performed on ceramic core that are over 300 μm thick to produce holes having a 30-50 μm radius. The through holes may be drilled from one side and is controlled so that the redistribution layer 320 is not damaged.

Figure 14:
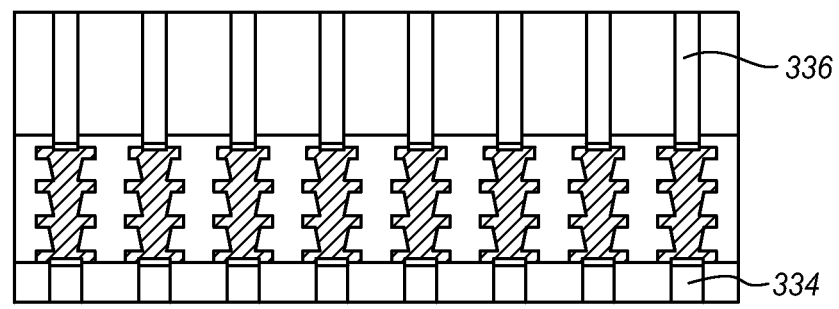

In FIG. 14, the through holes are plated or filled and capped so that they may be used as electrically conductive connectors between the dies and other dies and external components. The holes may be filled or plated in a variety of different ways. In one embodiment, electroless nickel plating is applied, followed by electroless copper plating. This is followed with a pure Sn or Sn/Cu alloy deep blind via electroplating. The parameters of the plating may be controlled by bath circulation, air agitation, metal concentration, etc. Sn works well for filling due to its high atomic weight. However, other materials may be used to suit other process parameters. Sn also provides a good surface for a solder joint. By using a small amount of electroless copper, the connection to the filled hole will primarily be Sn after reflow.

Figure 15:
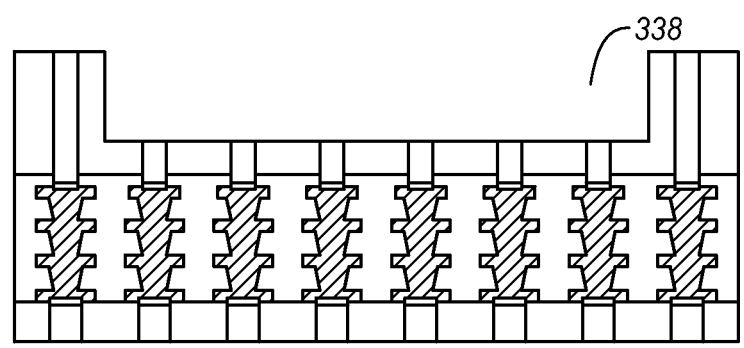

In FIG. 15, the pockets 338 are formed in the ceramic frame. As mentioned above, the ceramic slab may form the basis of a package with multiple pockets or multiple packages each with multiple pockets. As a result one or more pockets may be formed. The pockets may be formed by etching, machining, or using other techniques. In some embodiments, the pockets are formed by laser grooving technology. A laser drilling machine may be used to make different pockets with different sizes and depths to suit the mounting of different IC dies together in one frame or in different frames. The Sn or Sn/Cu pillars formed in the through holes 336 may also be partially drilled away during the laser grooving in the making of each pocket.

Using the described process multiple panels may be processed at the same time, to produce multiple packages each with multiple pockets. The resulting package may house more than 10 IC dies together in one ceramic frame so that one ceramic frame almost equals to 5~10 of existing packages in terms of functionality and value. The ceramic provides electrical insulation for all of the through holes, pads, passive devices, and other components together with high thermal conductivity to draw heat away from the dies.

FIG. 15 shows the completed but empty package ready for die attach. The dies may be mounted to the package in a variety of different ways. Conventional materials and processes may be used to mount the dies using solder reflow.

Figure 16:
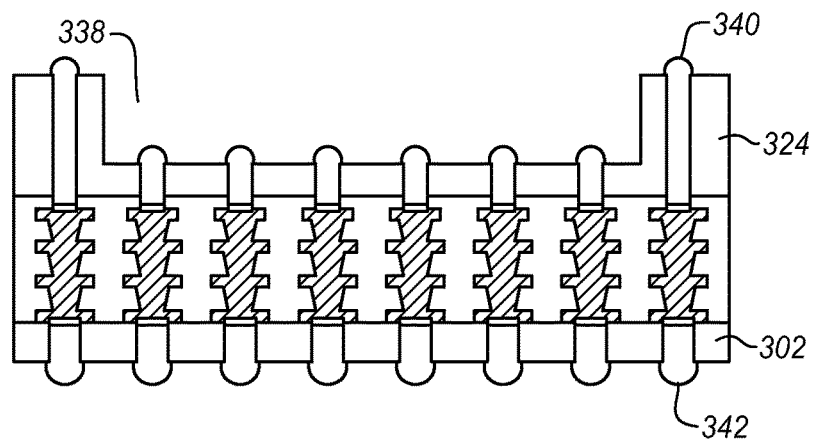
Figure 17:
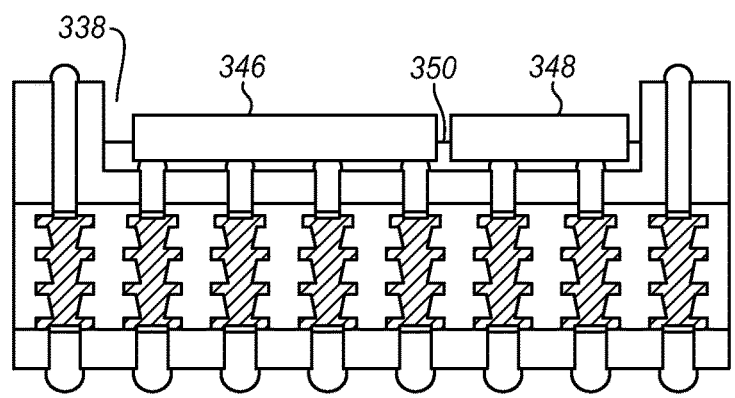
Figure 18:
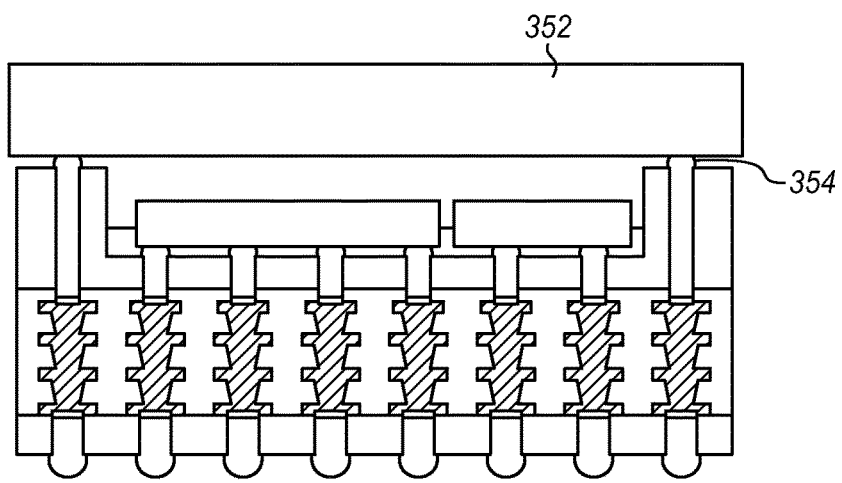

FIGS. 16-18 are cross-sectional side view diagrams of assembling a package using the ceramic frame with redistribution layer and bottom cap of FIG. 15. In FIG. 16, the empty package of FIG. 15, receives solder balls 340, 342 on the ends of the through holes on the top of the ceramic frame 324 as well as on the bottom of the bottom cap 302. The solder bumps or balls may be formed as described above by passing the structure through a simple reflow furnace process at low temperature to make the plated metal expand forming the bumps 340, 342. Alternatively the bumps or balls may be applied using any of a variety of other techniques.

In FIG. 17, an underfill 350 is applied to the bottom floor of the pocket 338 and one or more dies 346, 348 are placed over the appropriate solder balls. The dies are aligned so that pads on the dies are aligned with the solder balls and then the package is placed in a solder reflow furnace to attach the dies to the bottom floor of the pocket.

In FIG. 18, the top die 352 is similarly attached to the tops of the side walls of the package using solder balls 340 and an underfill 354. The package is again placed in the reflow furnace to solder the top die to the package. The package is then complete with all of the dies attached and is ready to be mounted to a main board, a socket, or any other desired platform.

Figure 19:
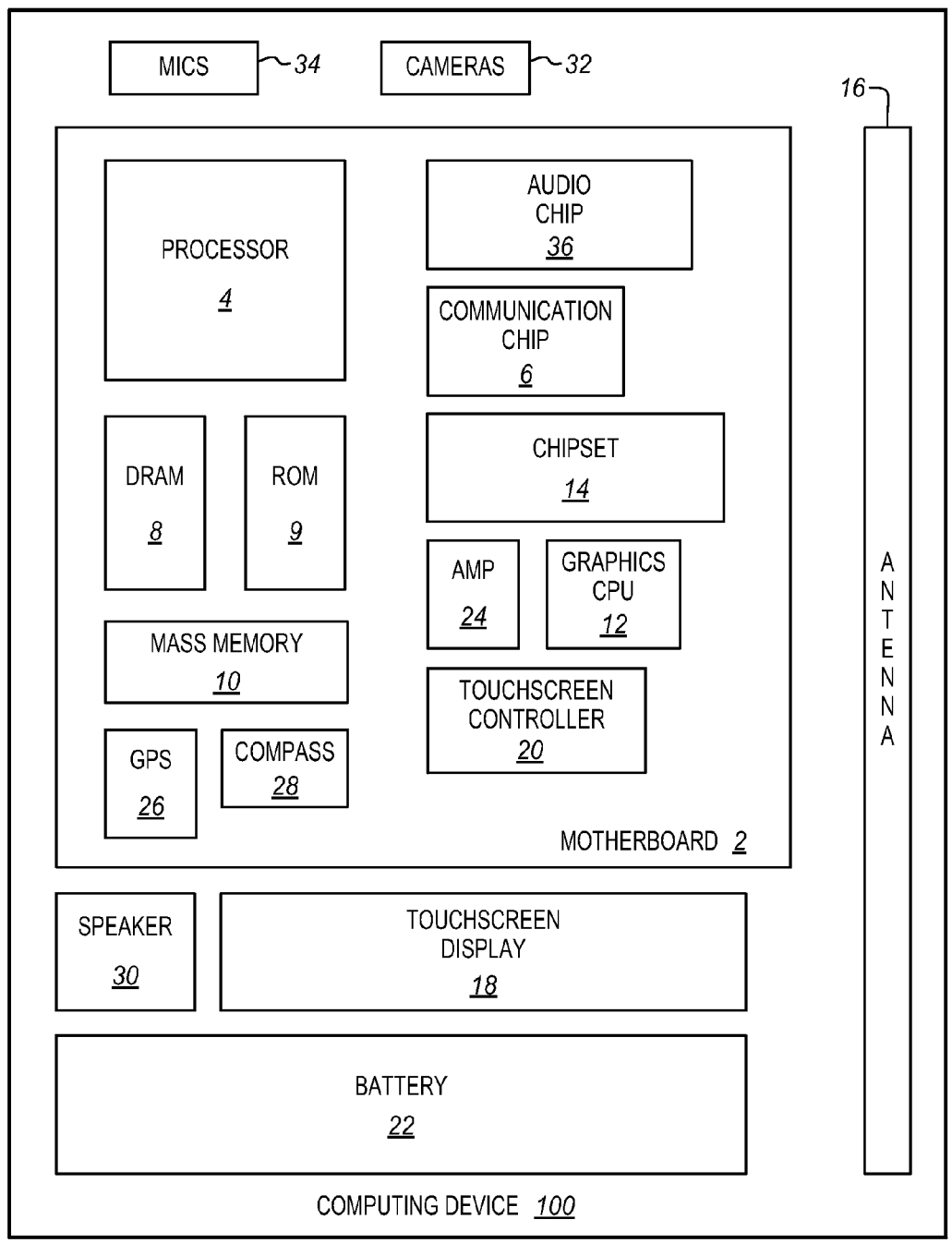
FIG. 19 is a block diagram of a computing device incorporating a package with a ceramic frame according to an embodiment.

FIG. 19 is a block diagram of a computing device 100 in accordance with one implementation of the invention. The computing device 100 houses a system board 2. The board 2 may include a number of components, including but not limited to a processor 4 and a chipset. The processor 4 is physically and electrically coupled to the board 2.

Depending on its applications, computing device 100 may include other components that may or may not be physically and electrically coupled to the board 2. These other components include, but are not limited to, a communication chip 6, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

Any one or more of the chips or processors may be packaged as described herein or several of the chips may be combined into a single package using a common ceramic frame as described.

In various implementations, the computing device 100 may be a server, a workstation, a laptop, a netbook, a notebook, an ultrabook, a smartphone, a tablet, a personal digital assistant (PDA), an ultra mobile PC, a mobile phone, a printer, a scanner, a monitor, a set-top box, an entertainment control unit, a digital camera, a portable music player, or a digital video recorder. In further implementations, the computing device 100 may be any other electronic device, such as a pen, a wallet, a watch, or an appliance that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an integrated circuit package that includes a ceramic frame having a top side and a bottom side, the top side having a pocket with a bottom floor and a plurality of conductive through holes in the bottom floor, an integrated circuit die attached to the bottom floor over the conductive through holes, and a redistribution layer on the bottom side connected to the conductive through holes.

In further embodiments the pocket is defined by side walls, the ceramic frame having a second plurality of conductive through holes in the side walls extending from the top side to the bottom side, the package further comprising a second integrated circuit die attached to the side walls on the top side and extending over the pocket to cover the pocket, the second die connecting to the second plurality of conductive through holes.

In further embodiments a portion of the first conductive through holes are coupled to a portion of the second conductive through holes through the redistribution layer to connect the first die to the second die.

Further embodiments include a ceramic bottom cap attached to the redistribution layer so that the redistribution layer is between the ceramic frame bottom side and the bottom cap.

In further embodiments the bottom cap has a third plurality of conductive through holes to connect the redistribution layer to external components.

In further embodiments the through holes are filled with Sn.

In further embodiments the through holes are covered with a Sn/Cu alloy and wherein the die is attached by solder reflow.

Further embodiments include a second integrated circuit die attached to the bottom floor over a portion of the conductive through holes and wherein the redistribution layer connects the first and the second die through the through holes.

In further embodiments the ceramic frame is formed from an alumina.

Further embodiments include passive devices attached to the bottom floor and coupled to the die.

Some embodiments pertain to a method with forming a redistribution layer on a ceramic slab, the redistribution layer having routing layers and vias between the routing layers, attaching a ceramic bottom cap over the redistribution layer, thinning the bottom cap, drilling through holes through the slab and the bottom cap so that the through holes connect to vias of the redistribution layer, plating the through holes with a conductive material, forming a pocket in the slab, the pocket having side walls and a bottom floor between the side walls, and attaching a die to the bottom floor so that the die is electrically coupled to the plated through holes.

In further embodiments forming a redistribution layer comprises patterning copper deposition layers and Ajinomoto Build up Film between the copper deposition layers.

In further embodiments forming a pocket in the slab comprises laser grooving the slab.

In further embodiments plating the through holes comprises electroplating the through holes with Sn.

In further embodiments attaching a die includes applying a low temperature solder reflow to the plated through holes to form solder balls over the through holes in the pocket, applying underfill to the bottom floor, placing a die over the solder balls in the pocket, and attaching the die using a solder reflow furnace.

In further embodiments drilling through holes comprises drilling through holes in the side walls, the method further comprising attaching a die over the pocket to cover the pocket.

Further embodiments include attaching passive devices to the bottom floor and connecting the passive devices to the die.

Some embodiments pertain to a computing device that includes a system board, a communication package connected to the system board, and an integrated circuit package connected to the system board, the integrated circuit package having a ceramic frame having a top side and a bottom side, the top side having a pocket with a bottom floor and a plurality of conductive through holes in the bottom floor, an integrated circuit die attached to the bottom floor over the conductive through holes, and a redistribution layer on the bottom side connected to the conductive through holes.

In further embodiments the integrated circuit package has a plurality of additional pockets with respective bottom floors and conductive through holes, each additional pocket having an additional integrated circuit die and wherein the redistribution layer extends between the additional pockets and connects the additional integrated circuit dies to each other.

In further embodiments the additional pockets of the integrated circuit package have different dimensions and are each covered with a further additional integrated circuit die.

What is claimed is:

1. An integrated circuit package comprising:
   a pocketed ceramic frame being a single ceramic slab, the slab comprising a top side and a bottom side, the top side having a pocket formed in the slab, the pocket having a bottom floor, side walls, and a plurality of conductive through holes in the bottom floor extending through the slab;
   an integrated circuit die attached to the bottom floor over the conductive through holes; and
   a redistribution layer on the bottom side connected to the conductive through holes.

2. The package of claim 1, the ceramic frame having a second plurality of conductive through holes in the side walls extending from the top side to the bottom side, the package further comprising a second integrated circuit die attached to the side walls on the top side and extending over the pocket to cover the pocket, the second die connecting to the second plurality of conductive through holes.

3. The package of claim 2, wherein a portion of the first conductive through holes are coupled to a portion of the second conductive through holes through the redistribution layer to connect the first die to the second die.

4. The package of claim 1, further comprising a ceramic bottom cap attached to the redistribution layer so that the redistribution layer is between the ceramic frame bottom side and the bottom cap.

5. The package of claim 1, wherein the bottom cap has a third plurality of conductive through holes to connect the redistribution layer to external components.

6. The package of claim 1, wherein the through holes are filled with Sn.

7. The package of claim 1, wherein the through holes are covered with a Sn/Cu alloy and wherein the die is attached by solder reflow.

8. The package of claim 1, further comprising a second integrated circuit die attached to the bottom floor over a portion of the conductive through holes and wherein the redistribution layer connects the first and the second die through the through holes.

9. The package of claim 1, wherein the ceramic frame is formed from an alumina.

10. The package of claim 1, further comprising passive devices attached to the bottom floor and coupled to the die.

11. A computing device comprising:
a system board;
a communication package connected to the system board; and
an integrated circuit package connected to the system board, the integrated circuit package having a pocketed ceramic frame being a single ceramic slab, the slab comprising a top side and a bottom side, the top side having a pocket formed in the slab, the pocket having a bottom floor, side walls, and a plurality of conductive through holes in the bottom floor extending through the slab, an integrated circuit die attached to the bottom floor over the conductive through holes, and a redistribution layer on the bottom side connected to the conductive through holes.

12. The computing device of claim 11, wherein the integrated circuit package has a plurality of additional pockets with respective bottom floors and conductive through holes, each additional pocket having an additional integrated circuit die and wherein the redistribution layer extends between the additional pockets and connects the additional integrated circuit dies to each other.

13. The computing device of claim 12, wherein the additional pockets of the integrated circuit package have different dimensions and are each covered with a further additional integrated circuit die.

14. The package of claim 1, wherein the through holes are plated with a conductive material.

15. The package of claim 1, wherein the redistribution layer comprises copper deposition layers and Ajinomoto Build up Film between the copper deposition layers.

16. The package of claim 1, the die is attached by solder balls over the through holes in the pocket and an underfill in the bottom floor.

17. The package of claim 1, further comprising a second die over the pocket to cover the pocket.

* * * * *